(12) United States Patent
Sumiya et al.

(10) Patent No.: US 12,729,456 B2
(45) Date of Patent: Sep. 8, 2026

(54) SYNTHETIC SINGLE CRYSTAL DIAMOND AND METHOD FOR PRODUCING SAME

(71) Applicant: SUMITOMO ELECTRIC INDUSTRIES, LTD., Osaka (JP)

(72) Inventors: Hitoshi Sumiya, Osaka (JP); Jin Hwa Lee, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 582 days.

(21) Appl. No.: 18/034,235

(22) PCT Filed: Nov. 2, 2021

(86) PCT No.: PCT/JP2021/040399
§ 371 (c)(1),
(2) Date: Apr. 27, 2023

(87) PCT Pub. No.: WO2022/097641
PCT Pub. Date: May 12, 2022

(65) Prior Publication Data

US 2023/0383436 A1 Nov. 30, 2023

(30) Foreign Application Priority Data

Nov. 4, 2020 (JP) ................................ 2020-184564

(51) Int. Cl.

| | |
|---|---|
| ***C30B 29/04*** | (2006.01) |
| ***C01B 32/26*** | (2017.01) |
| ***C01B 32/28*** | (2017.01) |
| ***C30B 9/10*** | (2006.01) |

(Continued)

(52) U.S. Cl.
CPC .............. *C30B 29/04* (2013.01); *C01B 32/26* (2017.08); *C01B 32/28* (2017.08); *C30B 9/10* (2013.01); *C30B 33/02* (2013.01); *C30B 33/04* (2013.01); *C01P 2006/21* (2013.01)

(58) Field of Classification Search
None
See application file for complete search history.

(56) References Cited

U.S. PATENT DOCUMENTS

| | | | | |
|---|---|---|---|---|
| 2010/0123098 | A1* | 5/2010 | Hemley | C30B 29/04 117/103 |
| 2010/0329965 | A1* | 12/2010 | Twitchen | C23C 16/277 117/88 |
| 2020/0325596 | A1 | 10/2020 | Sumiya et al. | |

FOREIGN PATENT DOCUMENTS

| | | | |
|---|---|---|---|
| JP | 2012-530676 | A | 12/2012 |
| JP | 2015-155377 | A | 8/2015 |
| JP | 2018-197178 | A | 12/2018 |

(Continued)

OTHER PUBLICATIONS

S. Eaton-Magaña and T. Ardon, "Temperature effects on luminescence centers in natural type IIb diamonds", Diamond & Related Materials, vol. 69, pp. 86-95, 2016 (cited in specification).

(Continued)

*Primary Examiner* — Guinever S Gregorio
(74) *Attorney, Agent, or Firm* — Renner, Otto, Boisselle & Sklar, LLP

(57) ABSTRACT

Provided is a synthetic single crystal diamond containing conjugants each composed of one vacancy and one boron atom, wherein the concentration of boron atoms based on atom numbers is 0.1 ppm or more and 100 ppm or less.

4 Claims, 2 Drawing Sheets

(51) Int. Cl.
*C30B 33/02* (2006.01)
*C30B 33/04* (2006.01)

(56) References Cited

FOREIGN PATENT DOCUMENTS

| | | | |
|---|---|---|---|
| WO | 2010/149777 | A1 | 12/2010 |
| WO | 2019/077888 | A1 | 4/2019 |

OTHER PUBLICATIONS

D. Howell et al., “Automated FTIR mapping of boron distribution in diamond”, Diamond & Related Materials, vol. 96, pp. 207-215, 2019 (cited in specification).

* cited by examiner

FIG.1

SYNTHETIC SINGLE CRYSTAL DIAMOND AND METHOD FOR PRODUCING SAME

The present disclosure relates to a synthetic single crystal diamond and a method for producing the same. The present application claims a priority based on Japanese Patent Application No. 2020-184564 filed on Nov. 4, 2020, the entire content of which is incorporated herein by reference.

TECHNICAL FIELD

Background Art

Since single crystal diamond has high hardness, it has been widely used in tools such as cutting tools, grinding tools, and anti-wear tools. Single crystal diamond used in tools includes natural diamond and synthetic diamond.

Most of the natural diamonds (type Ia diamond) contain aggregated nitrogen atoms as impurities. Aggregated nitrogen atoms in the diamond crystal can inhibit the plastic deformation and/or the development of cracks when the diamond is used in a tool. Therefore, natural diamond has high mechanical strength. However, since natural diamond varies greatly in quality and the supply thereof is not stable, there is a limit in using natural diamond in the industrial field.

On the contrary, synthetic diamond is constant in quality and may be supplied stably, and thereby is widely used in the industrial field.

Generally, synthetic diamond (type Ib diamond) contains isolated substitutional nitrogen atoms as impurities. There is a tendency that the mechanical properties of diamond will deteriorate as the concentration of isolated substitutional nitrogen atoms in diamond crystals increases. Therefore, when type Ib synthetic diamond is used in a tool, there is a tendency that the cutting edge thereof is likely to be worn or breakage.

Further, some synthetic diamonds (type IIa diamond) contain almost no nitrogen impurities. Since type IIa synthetic diamond does not contain impurities or crystal defects that inhibit the progress of cracks, when it is used in a tool, there is a tendency that the cutting edge of the tool is likely to be breakage.

Therefore, studies have been carried out on techniques for improving wear resistance and chipping resistance in synthetic diamonds.

For example, PTL 1 (WO 2019/077888) discloses a synthetic single crystal diamond having high hardness and excellent chipping resistance.

CITATION LIST

Patent Literature

PTL 1: WO 2019/077888

SUMMARY OF INVENTION

The synthetic single crystal diamond of the present disclosure is a synthetic single crystal diamond containing conjugants each composed of one vacancy and one boron atom, and the concentration of boron atoms based on atom numbers is 0.1 ppm or more and 100 ppm or less.

A method for producing a synthetic single crystal diamond according to the present disclosure is a method for producing the aforementioned synthetic single crystal diamond. The method includes a first step of synthesizing a diamond single crystal containing boron atoms at a concentration of 0.1 ppm or more and 100 ppm or less based on atom numbers by a temperature difference process using a solvent metal, a second step of irradiating the diamond single crystal with one or both of an electron beam and a particle beam so as to apply an energy of 10 MGy or more and 1000 MGy or less to the diamond single crystal, and a third step of applying a temperature of 600° C. or more and 1800° C. or less to the diamond single crystal after the second step for 1 minute or more and 3600 minutes or less to obtain the synthetic single crystal diamond.

BRIEF DESCRIPTION OF DRAWINGS

FIG. 1 is a view for illustrating a Knoop indentation; and

DETAILED DESCRIPTION

Figure 2:
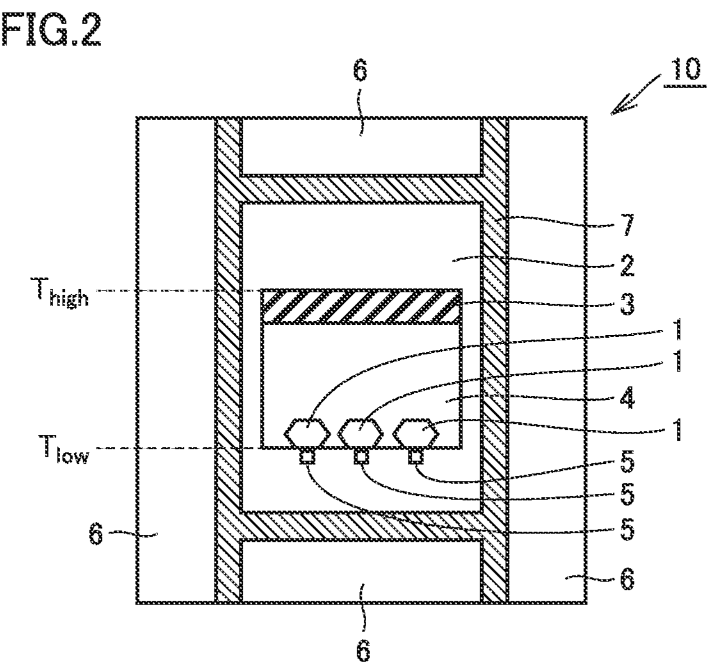
FIG. 2 is a cross-sectional view schematically illustrating an example configuration of a sample chamber used for producing a synthetic single crystal diamond according to an embodiment of the present disclosure.

Problem to be Solved by the Present Disclosure

In recent years, due to the demand for longer life of tools, there is a demand for a synthetic single crystal diamond having higher toughness and hardness, and excellent chipping resistance and wear resistance.

Accordingly, an object of the present invention is to provide a synthetic single crystal diamond having high toughness and hardness, and excellent chipping resistance and wear resistance, and a producing method thereof.

Advantageous Effect of the Present Disclosure

The synthetic single crystal diamond of the present disclosure has high toughness and hardness, and has excellent chipping resistance and wear resistance.

DESCRIPTION OF EMBODIMENTS

First, a description will be given on each aspect of the present disclosure.

(1) The synthetic single crystal diamond of the present disclosure is a synthetic single crystal diamond comprising conjugants each composed of one vacancy and one boron atom, and the concentration of boron atoms based on atom numbers is 0.1 ppm or more and 100 ppm or less.

The synthetic single crystal diamond of the present disclosure has high toughness and hardness, and has excellent chipping resistance and wear resistance.

(2) It is preferable that a ratio b/a of a length b of a short diagonal line to a length a of a long diagonal line in a pair of diagonal lines of a Knoop indentation in a <110> direction in a (001) plane of the synthetic single crystal diamond is 0.08 or less, and the Knoop indentation is formed in measuring a Knoop hardness of the synthetic single crystal diamond according to JIS Z 2251: 2009 under conditions of a temperature of 23° C.±5° C. and a test load of 4.9 N.

Thus, the synthetic single crystal diamond can have high toughness and excellent chipping resistance.

(3) It is preferable that the synthetic single crystal diamond has a Knoop hardness of 110 GPa or more in the <100> direction in the (001) plane.

Thus, the synthetic single crystal diamond can have excellent wear resistance.

(4) It is preferable that the synthetic single crystal diamond has a cracking load of 12 N or more in a breaking strength test in which a spherical diamond indenter having a tip radius of 50 μm is pressed against a surface of the synthetic single crystal diamond at a loading speed of 100 N/min.

Thus, the synthetic single crystal diamond can have excellent chipping resistance.

(5) A method for producing a synthetic single crystal diamond according to the present disclosure is a method for producing the aforementioned synthetic single crystal diamond. The method includes: a first step of synthesizing a diamond single crystal containing boron atoms at a concentration of 0.1 ppm or more and 100 ppm or less based on atom numbers by a temperature difference process using a solvent metal; a second step of irradiating the diamond single crystal with one or both of an electron beam and a particle beam so as to apply an energy of 10 MGy or more and 1000 MGy or less to the diamond single crystal; and a third step of applying a temperature of 600° C. or more and 1800° C. or less to the diamond single crystal after the second step for 1 minute or more and 3600 minutes or less to obtain the synthetic single crystal diamond.

Thus, it is possible to obtain a synthetic single crystal diamond having high toughness and hardness, and having excellent wear resistance and chipping resistance.

Details of Embodiments

In the present specification, the expression in the form of "A to B" refers to an upper limit and a lower limit of a range (in other words, A or more and B or less), and if A is described with no unit but B is described with a unit, it means that A and B have the same unit.

In the crystallographic indications in the present specification, a group of equivalent orientations is indicated by < >, and an individual plane is indicated by ( ).

The present inventors assumed that one of the factors that improve the toughness and hardness of a diamond crystal, i.e., the chipping resistance and wear resistance of the diamond crystal when used as a tool, is the effect of boron atoms that are present in the diamond crystal as an impurity. Isolated substitutional boron atoms are known as a form of boron atoms present as an impurity in the diamond crystal. Isolated substitutional boron atoms refer to those atoms that each replaces a carbon atom in a diamond crystal and exists at the position of the carbon atom as an atomic unit.

The present inventors assumed that the presence of vacancies adjacent to the boron atoms in the diamond crystal would more effectively prevent the progress of cracks and plastic deformation in the diamond crystal. As compared with the case where the boron atoms are present alone, the presence of vacancies is thought to mitigate an excessive compressive stress that would occur in the lattice and act as a starting point of breaking.

As a result of extensive investigations based on the above assumptions, the present inventors have newly found that the toughness and hardness, i.e., the chipping resistance and the wear resistance of the synthetic single crystal diamond can be improved by making boron atoms and vacancies adjacent to each other in the synthetic single crystal diamond and keeping the concentration of boron atoms in the synthetic single crystal diamond within a certain range, and thereby have completed the present disclosure.

Hereinafter, specific examples of the synthetic single crystal diamond of the present disclosure and a method for producing the same will be described with reference to the drawings. In the drawings of the present disclosure, the same reference sign indicates the same portion or an equivalent portion. Further, dimensional relationships of lengths, widths, thicknesses, depths and the like have been modified as appropriate in order for the clarification and simplification of the drawings and do not necessarily indicate actual dimensional relationships.

First Embodiment: Synthetic Single Crystal Diamond

The synthetic single crystal diamond of the present embodiment is a synthetic single crystal diamond containing conjugants each composed of one vacancy and one boron atom, and the concentration of boron atoms based on atom numbers is 0.1 ppm or more and 100 ppm or less.

The synthetic single crystal diamond of the present embodiment can have high toughness and hardness, and excellent chipping resistance and wear resistance. Although the reason therefor is not clear, but is assumed as described in the following (i) and (ii).

(i) The synthetic single crystal diamond of the present embodiment contains boron atoms and vacancies. Thus, in the synthetic single crystal diamond, it is likely to form conjugants each composed of one vacancy and one boron atom, which thereby prevents the progress of cracks and plastic deformation in the crystal. In addition, the presence of vacancies mitigates an excessive compressive stress, which may be caused by aggregation of boron atoms alone and serve as a starting point of breaking, thereby improving the wear resistance and the chipping resistance of the synthetic single crystal diamond.

(ii) The synthetic single crystal diamond of the present embodiment contains boron atoms at a concentration of 0.1 ppm or more and 100 ppm or less based on atom numbers. In the synthetic single crystal diamond, the compressive stress is appropriately generated, which thereby improves the wear resistance and the chipping resistance of the synthetic single crystal diamond.

<Boron Atom>

The synthetic single crystal diamond of the present embodiment contains boron atoms. The concentration of boron atoms based on atom numbers in the synthetic single crystal diamond (hereinafter referred to as "boron atom concentration") is 0.1 ppm or more and 100 ppm or less. The boron atoms in the synthetic single crystal diamond means all boron atoms contained in the synthetic single crystal diamond, and the presence form thereof is not limited. When the boron atom concentration is 0.1 ppm or more, an effect due to the presence of the boron atom can be easily obtained, and thereby the synthetic single crystal diamond can have high hardness and excellent chipping resistance. On the other hand, when the boron atom concentration is 100 ppm or less, the internal stress in the synthetic single crystal diamond is moderate, and a decrease in hardness or a decrease in chipping resistance due to the occurrence of excessive lattice defects is suppressed.

The lower limit of the boron atom concentration in the synthetic single crystal diamond may be 0.1 ppm or more, 0.3 ppm or more, 0.5 ppm or more, 2 ppm or more, or 10 ppm or more. The upper limit of the concentration of boron atoms in the synthetic single crystal diamond may be 100 ppm or less, 80 ppm or less, or 50 ppm or less. The concentration of boron atoms in the synthetic single crystal diamond may be 0.1 ppm or more and 100 ppm or less, 0.3 ppm or more and 100 ppm or less, 0.3 ppm or more and 80 ppm or less, 0.5 ppm or more and 100 ppm or less, 0.5 ppm or more and 80 ppm or less, 0.5 ppm or more and 50 ppm or less, 2 ppm or more and 100 ppm or less, 2 ppm or more and 80 ppm or less, 2 ppm or more and 50 ppm or less, 10 ppm or more and 100 ppm or less, 10 ppm or more and 80 ppm or less, or 10 ppm or more and 50 ppm or less.

The concentration of boron atoms in the synthetic single crystal diamond is measured by secondary ion mass spectrometry (SIMS). Here, it is preferable to measure a (111) growth sector which is likely to contain boron.

<Conjugant>

The synthetic single crystal diamond of the present embodiment contains conjugants each composed of one vacancy and one boron atom. In the present specification, the conjugate is also denoted as "BV". The fact that the synthetic single crystal diamond contains conjugants each composed of one vacancy and one boron atom is confirmed by the presence of a luminescence peak within a fluorescence wavelength range of 776.4±1 nm in a fluorescent spectrum obtained by irradiating the synthetic single crystal diamond with an excitation light having a wavelength of 488 nm, 514 nm or 532 nm. Here, "the presence of a luminescence peak in the fluorescence wavelength range of 776.4±1 nm" can be confirmed by comparing the intensity of the luminescence peak with the intensity of the Raman peak of diamond that appears around 521.9 nm in the case of excitation at a wavelength of 488 nm, for example. Specifically, for example, when an excitation light having a wavelength of 488 nm is irradiated, a peak intensity IA that is present in the fluorescence wavelength range of 776.4±1 nm is compared with a peak intensity JIB of the Raman peak of diamond that appears around the wavelength of 521.9 nm, and if the intensity IA is larger than the intensity IB, it is determined that the luminescence peak is present in the fluorescence wavelength range of 776.4±1 nm.

The details of the confirmation method mentioned above are described in "Temperature effects on luminescence centers in natural type IIb diamonds" written by Sally Eaton-Magana, Troy Ardon, and published in Diamond and Related Materials, volume 69 (2016), pages 86-95.

After investigations, the present inventors have found that, depending on the presence of boron atoms, excessive lattice distortion may occur around the boron atoms, which may serve as the starting point of breaking. The present inventors have newly found that the presence of conjugants each composed of one vacancy and one boron atom in synthetic single crystal diamond can mitigate the excessive lattice distortion.

The synthetic single crystal diamond of the present embodiment may contain isolated substitutional boron atoms.

The lower limit of the concentration of the isolated substitutional boron atoms based on atom numbers in the synthetic single crystal diamond of the present embodiment may be 0 ppm or more, 0.01 ppm or more, 0.03 ppm or more, 0.06 ppm or more, 0.08 ppm or more, 0.09 ppm or more, 0.1 ppm or more, 0.6 ppm or more, 1.2 ppm or more, 1.6 ppm or more, 3 ppm or more, or 6 ppm or more. The upper limit of the concentration of the isolated substitutional boron atoms based on atom numbers in the synthetic single crystal diamond may be 70 ppm or less, 60 ppm or less, 30 ppm or less, or 10 ppm or less. The concentration of the isolated substitutional boron atoms based on atom numbers in the synthetic single crystal diamond may be 0 ppm or more and 70 ppm or less, 0.01 ppm or more and 70 ppm or less, 0.03 ppm or more and 70 ppm or less, 0.06 ppm or more and 70 ppm or less, 0.08 ppm or more and 70 ppm or less, 0.09 ppm or more and 70 ppm or less, 0.1 ppm or more and 70 ppm or less, 0.6 ppm or more and 70 ppm or less, 1.2 ppm or more and 70 ppm or less, 1.6 ppm or more and 70 ppm or less, 3 ppm or more and 70 ppm or less, 6 ppm or more and 70 ppm or less, 0 ppm or less and 30 ppm or less, 0.01 ppm or more and 30 ppm or less, 0.03 ppm or more and 30 ppm or less, 0.06 ppm or more and 30 ppm or less, 0.08 ppm or more and 30 ppm or less, 0.09 ppm or more and 30 ppm or less, 0.1 ppm or more and 30 ppm or less, 0.6 ppm or more and 30 ppm or less, 1.2 ppm or more and 30 ppm or less, 1.6 ppm or more and 30 ppm or less, 6 ppm or more and 30 ppm or less, 0 ppm or more and 10 ppm or less, 0.01 ppm or more and 10 ppm or less, 0.1 ppm or more and 10 ppm or less, 0.6 ppm or more and 10 ppm or less, 1.2 ppm or more and 10 ppm or less, 1.6 ppm or more and 10 ppm or less, 3 ppm or more and 10 ppm or less, or 6 ppm or more and 10 ppm or less.

The concentration of the isolated substitutional boron atoms based on atom numbers in the synthetic single crystal diamond of the present embodiment is measured by the following procedures (A1) to (A3).

(A1) The synthetic single crystal diamond is processed into a plate having a thickness of about 1 mm to 0.1 mm, and two surfaces through which light is transmitted are polished to mirror surfaces, and then the absorbance is measured at a wave number of 800 to 5000 $cm^{-1}$ by Fourier transform infrared spectroscopy (FT-IR) to create an infrared absorption spectrum. If the content of boron is as large as several tens of ppm or more, the transmittance is small and sufficient evaluation becomes difficult, and thereby, it is required to reduce the thickness to about 0.1 mm. Further, it is preferable to evaluate the (111) growth sector which is likely to contain boron.

(A2) The absorption peak height $H_{2800}$ at a wave number of 2800 $cm^{-1}$ is calculated from the infrared absorption spectrum.

(A3) The concentration ([B]) of the isolated substitutional boron atoms is calculated from the absorption peak height $H_{2800}$ by the following equation:

$$[B]\ (ppm)=0.0350\times H_{2800}\ (cm^{-1})$$

wherein $H_{2800}$ ($cm^{-1}$) represents the FT-IR absorption height.

When the absorption peak at the wave number of 2800 $cm^{-1}$ is saturated, the sample thickness is reduced, or the concentration ([B]) of the isolated substitutional boron atoms is calculated from the absorption peak height $H_{2458}$ at the wave number of 2458 $cm^{-1}$ or the absorption peak height $H_{1290}$ at the wave number of 1290 $cm^{-1}$ by the following equations:

$$[B]\ (ppm)=0.105\times H_{2459}\ (cm^{-1})$$

$$[B]\ (ppm)=1.00\times H_{1290}\ (cm^{-1})$$

wherein $H_{2458}$ ($cm^{-1}$) and $H_{1290}$ ($cm^{-1}$) represent the FT-IR absorption heights.

The details of the measuring method mentioned above are described in "Automated FTIR mapping of boron distribution in diamond" written by Howell et al, and published in Diamond and Related Materials, volume 96 (2019), pages 207-215.

<Ratio b/a of Diagonal Lines of Knoop Indentation in <110> Direction in (001) Plane>

In the synthetic single crystal diamond of the present embodiment, it is preferable that a ratio b/a of a length b of a short diagonal line to a length a of a long diagonal line in a pair of diagonal lines of a Knoop indentation in a <110> direction in a (001) plane (hereinafter also referred to as a "Knoop indentation of (001) <110>") is 0.08 or less, and the Knoop indentation is formed in measuring a Knoop hardness of the synthetic single crystal diamond according to JIS Z 2251: 2009 under conditions of a temperature of 23° C.±5° C. and a test load of 4.9 N.

The measurement of the Knoop hardness is known as one of the criteria indicating the hardness of industrial materials as defined in JIS Z2251; 2009, in which the hardness of a material to be measured is determined by pressing a Knoop indenter against the material at a predetermined temperature and a predetermined load (test load).

Here, the Knoop indenter is a diamond indenter having a rhombic quadrangular prism shape on the bottom surface. In addition, in the rhombic shape of the bottom surface, the ratio b'/a' of the length b' of the short diagonal line to the length a' of the long diagonal line of the diagonal lines is specified to be 0.141. In addition, the Knoop indentation refers to a mark remaining at a site from which the Knoop indenter has been released immediately after the Knoop indenter has been pressed against the material to be measured (the synthetic single crystal diamond in the present embodiment) at the above-described temperature and the above-described test load. In the present embodiment, an indentation (Knoop indentation) is made in the <110> direction in the (001) plane of the synthetic single crystal diamond according to JIS Z 2251: 2009 under conditions of a temperature of 23° C.±5° C. and a test load of 4.9 N.

In the synthetic single crystal diamond of the present embodiment, it is preferable that the ratio b/a of the diagonal lines of the Knoop indentation is 0.08 or less and is smaller than the ratio b'/a' (0.141) of the original Knoop indentation. This is because the material to be measured, i.e., the synthetic single crystal diamond has a large elastic deformation property, and a recovery (elastic recovery) in which the indentation attempts to elastically return to the original state occurs.

Figure 1:
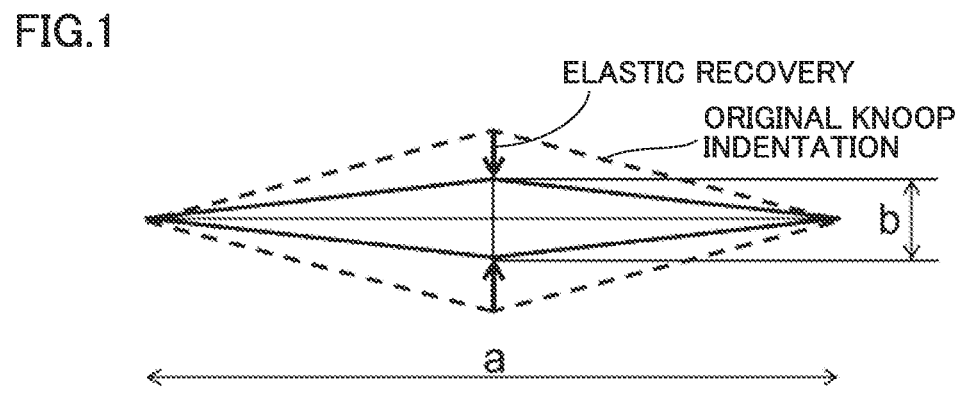

The above-described phenomenon will be described with reference to FIG. 1 that schematically illustrates a Knoop indentation. For example, if a material to be measured exhibits no elastic recovery at all, the cross section of the Knoop indenter and the Knoop indentation have the same shape (a portion denoted as "original Knoop indentation" in FIG. 1). On the other hand, since the synthetic single crystal diamond of the present embodiment has a large elastic deformation property, elastic recovery occurs in the direction of the arrow in the figure, and accordingly, the Knoop indentation becomes a rhombus shape as indicated by the solid line in the drawing. That is, as the return in the direction of the arrow in the figure increases, the value of the ratio b/a decreases. This indicates that, the smaller the value of the ratio b/a is, the greater the elastic deformation property is.

The synthetic single crystal diamond of the present embodiment has a large elastic deformation property because the ratio b/a of diagonal lines of the Knoop indentation is 0.08 or less. As elastic deformation becomes larger, the toughness becomes larger, and thus the synthetic single crystal diamond becomes tougher.

The upper limit of the ratio b/a of the diagonal lines of the Knoop indentation may be 0.08 or less, 0.075 or less, 0.07 or less, 0.065 or less, or 0.06 or less. The smaller the ratio b/a of the diagonal lines of the Knoop indentation, the greater the elastic deformation property, and therefore, there is no need to limit the lower limit. In a case where no plastic deformation or breaking occurs, b/a becomes zero accordingly, and the Knoop indentation becomes only one line in the direction of the long diagonal line. Therefore, the lower limit of the ratio b/a of the diagonal lines of the Knoop indentation may be 0 or more. The ratio b/a of the diagonal lines of the Knoop indentation may be 0 or more and 0.08 or less, 0 or more and 0.075 or less, 0 or more and 0.07 or less, 0 or more and 0.065 or less, 0 or more and 0.06 or less, 0 or more and 0.055 or less, 0 or more and 0.05 or less, 0 or more and 0.045 or less, or 0 or more and 0.04 or less.

<Knoop Hardness>

The Knoop hardness of the synthetic single crystal diamond according to the present embodiment in the <100> direction in the (001) plane (hereinafter also referred to as "(001) <100> Knoop hardness") is preferably 110 GPa or more. A synthetic single crystal diamond having a (001) <100> Knoop hardness of 110 GPa or more has higher hardness and excellent wear resistance than natural diamond containing nitrogen.

The lower limit of the (001) <100> Knoop hardness of the synthetic single crystal diamond may be 110 GPa or more, 113 GPa or more, 115 GPa or more, 118 GPa or more, 120 GPa or more, 122 GPa or more, 123 GPa or more, 125 GPa or more. The upper limit of the (001) <100> Knoop hardness of the synthetic single crystal diamond is not particularly limited, but may be, for example, 150 GPa or less from the viewpoint of production. The (001) <100> Knoop hardness of the synthetic single crystal diamond may be 110 GPa or more and 150 GPa or less, 113 GPa or more and 150 GPa or less, 115 GPa or more and 150 GPa or less, 118 GPa or more and 150 GPa or less, 120 GPa or more and 150 GPa or less, 122 GPa or more and 150 GPa or less, 123 GPa or more and 150 GPa or less, or 125 GPa or more and 150 GPa or less.

A method of evaluating the (001) <100> Knoop hardness (hereinafter also referred to as HK having a unit of GPa) of synthetic single crystal diamond will be described. First, an indentation is formed with a load of 4.9 N in the <100> direction in the (001) plane of the synthetic single crystal diamond. The long diagonal line "a" (μm) of the obtained indentation is measured, and the Knoop hardness (HK) is calculated by the following equation A. The Knoop hardness is measured at 23° C.±5° C.

$$HK=14229\times4.9/a^2 \quad \text{Equation A}$$

<Cracking Load>

Preferably, the synthetic single crystal diamond of the present embodiment has a cracking load of 12 N or more in a breaking strength test in which a spherical diamond indenter having a tip radius (R) of 50 μm is pressed against a surface of the synthetic single crystal diamond at a loading speed of 100 N/min. When the cracking load is 12 N or more, the synthetic single crystal diamond has excellent breaking strength and chipping resistance. When the synthetic single crystal diamond is used as a cutting tool, the chipping of the cutting edge is unlikely to occur even in cutting any difficult-to-cut hard material.

The lower limit of the cracking load may be 12 N or more, 13 N or more, 14 N or more, 15 N or more, 16 N or more, 17 N or more, 18 N or more, 20 N or more, 22 N or more. The upper limit of the cracking load is not particularly limited, but from the viewpoint of production, it is, for example, 50 N or less. The cracking load of the synthetic single crystal diamond may be 12 N or more and 50 N or less, 13 N or more and 50 N or less, 14 N or more and 50 N or less, 15 N or more and 50 N or less, 16 N or more and 50 N or less, 17 N or more and 50 N or less, 18 N or more and 50 N or less, 20 N or more and 50 N or less, or 22 N or more and 50 N or less.

The breaking strength test is performed under the following conditions. A spherical diamond indenter with a tip radius (R) of 50 μm is pressed against the sample, a load is applied to the sample at a loading speed of 100 N/min, and the load at the moment when a crack occurs in the sample (cracking load) is measured. The test temperature is 23° C.±5° C. The moment when a crack occurs is measured using an AE sensor. The larger the cracking load, the higher the strength of the sample and the better the chipping resistance.

When an indenter with a tip radius (R) smaller than 50 μm is used as the measuring indenter, the sample is plastically deformed before a crack is generated, and the strength against cracks may not be measured accurately. On the contrary, an indenter with a tip radius (R) larger than 50 μm may be used to perform the measurement, but in this case, a greater load is required until a crack occurs and the contact area between the indenter and the sample increases, which may affect the measurement accuracy due to the surface accuracy of the sample and may greatly affect the crystal orientation of the crystal. Therefore, it is preferable to use an indenter with a tip radius (R) of 50 μm in the breaking strength test for a synthetic single crystal diamond.

<Applications>

The synthetic single crystal diamond of the present embodiment has high toughness and hardness, has excellent chipping resistance and wear resistance when used as a tool, and has stable quality, and can be applied to various applications. For example, the synthetic single crystal diamond may be used as a material for a wear-resistant tool such as a dresser, a wire drawing die, a stylus, a scribing tool or a water jet orifice, a precision cutting tool, or a cutting tool such as a wood cutter. The tool produced from the synthetic single crystal diamond of the present embodiment can perform stable machining for a long time and has an excellent tool life as compared with a tool produced from a conventional synthetic diamond, a natural diamond or a diamond sintered material.

Further, since the synthetic single crystal diamond of the present embodiment has electrical conductivity depending on the residual state of boron impurities, it may be applied to applications such as electric current assisted cutting or electric current assisted grinding. Further, since the tribo-microplasma phenomenon does not occur because of the electrical conductivity, the synthetic single crystal diamond of the present embodiment can be preferably used as a processing tool for processing glass, resin, and insulating material. Further, the addition of boron forms an oxide film on the diamond surface, which is expected to improve sliding property and wear resistance.

Second Embodiment: Method for Producing Synthetic Single Crystal Diamond

An example method for producing the synthetic single crystal diamond of the first embodiment will be described below. The synthetic single crystal diamond of the first embodiment is not limited to a synthetic single crystal diamond produced by the following producing method, it may be a synthetic single crystal diamond produced by a different producing method.

The method for producing the synthetic single crystal diamond of the present embodiment is a method for producing a synthetic single crystal diamond of the first embodiment. The method includes a first step of synthesizing a diamond single crystal containing boron atoms at a concentration of 0.1 ppm or more and 100 ppm or less based on atom numbers by a temperature difference process using a solvent metal, a second step of irradiating the diamond single crystal with one or both of an electron beam and a particle beam so as to apply an energy of 10 MGy or more and 1000 MGy or less to the diamond single crystal, and a third step of applying a temperature of 600° C. or more and 1800° C. or less to the diamond single crystal after the second step for 1 minute or more and 3600 minutes or less to obtain the synthetic single crystal diamond.

(First Step)

First, a diamond single crystal containing boron atoms at a concentration of 0.1 ppm or more and 100 ppm or less based on atom numbers is synthesized by a temperature difference method using a solvent metal. The diamond single crystal may be produced by a temperature differential method in, for example, a sample chamber 10 having a configuration illustrated in FIG. 2.

As illustrated in FIG. 2, in the sample chamber 10 used for the production of a diamond single crystal 1, an insulator 2, a carbon source 3, a solvent metal 4 and seed crystals 5 are placed in a space surrounded by a graphite heater 7, and a pressure medium 6 is placed outside the graphite heater 7. The temperature difference process is a synthesis process in which a temperature gradient in the vertical direction is provided inside the sample chamber 10, the carbon source 3 is placed in a high temperature portion ($T_{high}$) and the seed crystals 5 are placed in a low temperature portion ($T_{low}$), the solvent metal 4 is placed between the carbon source 3 and the seed crystals 5, and the diamond single crystal 1 is grown on each of the seed crystals 5 by maintaining the temperature equal to or more than a temperature at which the solvent metal 4 is dissolved and the pressure equal to or more than a pressure at which the diamond is thermally stable.

It is preferable to use diamond powder as the carbon source 3. Graphite or pyrolytic carbon may also be used. As the solvent metal 4, at least one metal selected from iron (Fe), cobalt (Co), nickel (Ni), manganese (Mn) and the like, or an alloy containing these metals may be used. In order to prevent nitrogen impurities from being mixed into the diamond single crystal, it is preferable to add, as a nitrogen getter, an element that has a high affinity for nitrogen, such as aluminum (Al) or titanium (Ti), in an appropriate amount to the solvent metal.

The carbon source 3 or the solvent metal 4 may include a boron source which is added as a simple substance or a mixture of, for example, boron powder (B), boron carbide (such as $B_4C$), iron carbide (such as $Fe_2B$) and the like. Diamond powder or graphite containing a large amount of boron may be added to the carbon source 3. Thereby, the synthesized diamond single crystal may contain boron atoms, and the boron atoms contained in the diamond single crystal are mainly present as isolated substitutional impurities.

The concentration of the boron source in the carbon source 3 or in the solvent metal 4 may be adjusted such that the concentration of boron atoms based on atom numbers in the diamond single crystal to be synthesized is 0.1 ppm or more and 100 ppm or less. For example, in the carbon source, the mass concentration of boron atoms derived from the boron source may be adjusted to 5 ppm or more and 25000 ppm or less.

The lower limit of the concentration of boron atoms based on atom numbers in the boron-containing diamond single crystal which serves as the starting material of the synthetic single crystal diamond of the present embodiment may be 0.1 ppm or more, 0.3 ppm or more, or 0.5 ppm or more. The upper limit of the concentration of boron atoms based on atom numbers in the diamond single crystal can be 100 ppm or less, 80 ppm or less, or 50 ppm or less. The concentration of boron atoms based on atom numbers in the diamond single crystal may be 0.1 ppm or more and 100 ppm or less, 0.3 ppm or more and 80 ppm or less, or 0.5 ppm or more and 50 ppm or less.

The concentration of boron atoms in the diamond single crystal is measured by secondary ion mass spectrometry (SIMS).

The solvent metal 4 may further contain at least one element selected from the group consisting of titanium (Ti), vanadium (V), chromium (Cr), manganese (Mn), copper (Cu), zirconium (Zr), niobium (Nb), molybdenum (Mo), ruthenium (Ru), rhodium (Rh), hafnium (Hf), tantalum (Ta), tungsten (W), osmium (Os), iridium (Ir), and platinum (Pt).

(Second Step)

Next, the obtained diamond single crystal is irradiated with one or both of an electron beam and a particle beam so as to apply an energy of 10 MGy or more and 1000 MGy or less to the diamond single crystal. As the particle beam, a neutron beam or a proton beam may be used. As a result, lattice defects are introduced into the diamond single crystal, and thereby vacancies are formed.

If the amount of irradiation energy is less than 10 MGy, the introduction of lattice defects may be insufficient. On the contrary, if the amount of energy is greater than 1000 MGy, excessive vacancies may be formed, which may greatly deteriorate the crystallinity. Therefore, the amount of energy is preferably 10 MGy or more and 1000 MGy or less.

The irradiation conditions are not particularly limited as long as the amount of energy applied to the diamond single crystal is 10 MGy to 1000 MGy. For example, in the case of using an electron beam, the irradiation energy may be 2 MeV or more and 4.8 MeV or less, the current may be 2 mA or more and 5 mA or less, and the irradiation time may be 30 hours or more and 45 hours or less.

(Third Step)

Next, a temperature of 600° C. or more and 1800° C. or less is applied to the diamond single crystal after the second step for 1 minute or more and 3600 minutes or less, whereby a synthetic single crystal diamond is obtained. As a result, the vacancies in the diamond single crystal are moved to bond with boron atoms to form the conjugants each composed of one vacancy and one boron atom.

When the temperature of the third step is 600° C. or more, the formation of the conjugate is promoted. When the temperature of the third step is less than 600° C., most of the isolated vacancies will remain, which greatly decrease the hardness of the diamond single crystal. The upper limit of the temperature of the third step is preferably 1800° C. or less from the viewpoint of cost and productivity.

The time period during which the temperature of 600° C. or more and 1800° C. or less is applied to the diamond single crystal is 1 minute or more and 3600 minutes or less. This time period may be 60 minutes or more and 360 minutes or less.

The second step and the third step each may be performed once as one cycle, and the cycle may be repeated twice or more, which makes it possible to promote the formation of the conjugates in the diamond single crystal.

Examples

The present disclosure will be described in more detail with reference to examples. However, the scope of the present disclosure is not limited to these examples.

[Production of Synthetic Single Crystal Diamond]

(First Step)

Diamond single crystals are synthesized in a sample chamber having the configuration illustrated in FIG. 2 by the temperature difference process using a solvent metal.

An alloy composed of iron and cobalt is prepared as the solvent metal, and aluminum is added to the solvent metal at an amount of 3% by mass as a nitrogen getter.

Diamond powder is used as the carbon source, and approximately 0.5 mg of diamond single crystal is used as the seed crystal. Boron powder is added to the carbon source (diamond powder) as the boron source. The concentrations of boron based on mass in the carbon source are listed in the column "concentration of boron (ppm)" of the "production conditions" in Table 1. For example, in sample 1, the concentration of boron based on mass in the carbon source is 5 ppm.

The temperature in the sample chamber is adjusted by using a heater so that a temperature difference of several tens of degrees is formed between the high temperature portion where the carbon source is disposed and the low temperature portion where the seed crystal is disposed. In addition, an ultrahigh pressure generator is used to control the pressure to 5.5 GPa and the temperature of the low temperature portion in the range of 1370° C.±10° C. (1360° C. to 1380° C.), and the controlled pressure and temperature are kept for 60 hours, and thereby the diamond single crystals are synthesized on the seed crystal.

(Second Step)

Next, the obtained diamond single crystals are irradiated with an electron beam. The irradiation condition is set to include an irradiation energy of 4.6 MeV, a current of 2 mA, and an irradiation time of 30 hours. This irradiation condition is the same as the irradiation condition for applying an energy of 100 MGy to a diamond single crystal. In the column of "electron beam irradiation (100 MGy)" of the "production conditions" in Table 1, when the electron beam irradiation is performed, it is denoted as "Yes", and when the electron beam irradiation is not performed, it is denoted as "No".

(Third Step)

Next, the temperatures listed in the column "third step temperature (° C.) (60 minutes)" of the "production conditions" in Table 1 are applied to the diamond single crystals after the electron beam irradiation for 60 minutes to obtain synthetic single crystal diamonds. For example, in sample 2, a temperature of 500° C. is applied to the diamond single crystal for 60 minutes. When the third step is not performed, "No" is described in the column "third step temperature (° C.) (60 minutes)".

TABLE 1

| | Production Conditions | | | Synthetic Single Crystal Diamond | | | | | |
|---|---|---|---|---|---|---|---|---|---|
| Sample No. | Concentration of Boron in Carbon Source (ppm) | Electron Beam Irradiation (100 MGy) | Third Step Temperature (° C.) (60 minutes) | Concentration of Total Boron Atoms (ppm) | Concentration of Isolated Substitutional Boron Atoms (ppm) | Luminescence Peak within 776.4 ± 1 nm | b/a | (001)<100> Knoop Hardness (GPa) | Cracking Load (N) |
| 1 | 5 | No | No | 0.1 | 0.1 | None | 0.09 | 120 | 15 |
| 2 | 5 | Yes | 500 | 0.1 | 0 | None | 0.095 | 95 | 12 |
| 3 | 5 | Yes | 600 | 0.1 | 0 | Weak | 0.075 | 110 | 12 |
| 4 | 5 | Yes | 800 | 0.1 | 0.01 | Weak | 0.07 | 115 | 15 |
| 5 | 5 | Yes | 1000 | 0.1 | 0.03 | Strong | 0.055 | 123 | 18 |
| 6 | 5 | Yes | 1200 | 0.1 | 0.06 | Strong | 0.05 | 125 | 17 |
| 7 | 5 | Yes | 1400 | 0.1 | 0.08 | Weak | 0.065 | 122 | 14 |
| 8 | 5 | Yes | 1600 | 0.1 | 0.09 | Weak | 0.08 | 120 | 12 |
| 9 | 5 | Yes | 1800 | 0.1 | 0.1 | None | 0.09 | 115 | 15 |
| 10 | 100 | No | No | 2 | 1.8 | None | 0.095 | 108 | 18 |
| 11 | 100 | Yes | 1000 | 2 | 0.6 | Strong | 0.05 | 123 | 20 |
| 12 | 100 | Yes | 1200 | 2 | 1.2 | Strong | 0.045 | 125 | 22 |
| 13 | 100 | Yes | 1400 | 2 | 1.6 | Weak | 0.06 | 123 | 18 |
| 14 | 1000 | No | No | 10 | 8 | None | 0.1 | 105 | 16 |
| 15 | 1000 | Yes | 1000 | 10 | 3 | Strong | 0.05 | 118 | 20 |
| 16 | 1000 | Yes | 1200 | 10 | 6 | Strong | 0.04 | 120 | 22 |
| 17 | 25000 | No | No | 100 | 75 | None | 0.11 | 102 | 15 |
| 18 | 25000 | Yes | 1000 | 100 | 30 | Strong | 0.055 | 115 | 18 |
| 19 | 25000 | Yes | 1200 | 100 | 60 | Strong | 0.05 | 115 | 20 |

<Evaluation>

The obtained synthetic single crystal diamonds (note that sample 1, sample 10, sample 14, and sample 17 are diamond single crystals obtained in the first step) were subjected to the measurement of the concentration of total boron atoms, the measurement of the concentration of isolated substitutional boron atoms, the measurement of the fluorescent spectrum, the measurement of the (001) <100> Knoop hardness, the measurement of the ratio b/a of diagonal lines of the (001) <110> Knoop indentation, and the breaking strength test. All of the measurements are performed in the {111} growth sector of the synthetic single crystal diamond.

(Measurement of Concentration of Boron Atoms)

The concentration of boron atoms based on atom numbers in the synthetic single crystal diamond of each sample is measured by SIMS analysis. The results are listed in the column "concentration of total boron atoms (ppm)" of "synthetic single crystal diamond" in Table 1.

(Measurement of Concentration of Isolated Substitutional Boron Atoms)

The concentration of isolated substitutional boron atoms based on atom numbers in the synthetic single crystal diamond of each sample is measured. Since the specific measuring method has been described in the procedures (A1) to (A3) of the first embodiment, the description thereof will not be repeated. The results are listed in the column "concentration of isolated substitutional boron atoms (ppm)" of "synthetic single crystal diamond" in Table 1.

(Fluorescent Spectrum)

The surface of the synthetic single crystal diamond of each sample is mirror polished, and then irradiated with excitation light having the wavelength of 488 nm to measure the fluorescent spectrum. In the obtained fluorescent spectrum, the presence or absence of a luminescence peak within the fluorescent wavelength range of 776.4±1 nm and the intensity thereof are confirmed. The results are listed in the column "luminescence peak within 776.4±1 nm" of "synthetic single crystal diamond" in Table 1. In the column, the term "strong" means that a luminescence peak is present at the wavelength of 776.4±1 nm, the intensity of the luminescence peak is 50% or more with respect to the intensity of luminescence corresponding to the Raman scattering light of the diamond (the Raman peak of the diamond that appears around the wavelength of 521.9 nm), which indicates that the synthetic single crystal diamond contains conjugants each composed of one vacancy and one boron atom. The term "weak" means that a luminescence peak is present at the wavelength of 776.4±1 nm, and the intensity of the luminescence peak is 50% or less with respect to the intensity of luminescence of the Raman scattering light of the diamond a that appears around the wavelength of 522 nm, which indicates that the synthetic single crystal diamond contains conjugants each composed of one vacancy and one boron atom. "None" indicates that there is no luminescence peak at a wavelength of 776.4±1 nm, and the synthetic single crystal diamond does not contain conjugants each composed of one vacancy and one boron atom.

(Measurement of (001) <100> Knoop Hardness)

The (001) <100> Knoop hardness is measured for the synthetic single crystal diamond of each sample. Since the specific measuring method has been described in the first embodiment, the description thereof will not be repeated. The results are listed in the column "(001)<100> Knoop hardness" of "synthetic single crystal diamond" in Table 1. The greater the (001)<100> Knoop hardness, the better the wear resistance.

(Measurement of Ratio b/a of Diagonal Lines of (001) <110> Knoop Indentation)

The length a of the long diagonal line and the length b of the short diagonal line are measured for each Knoop indentation formed in the <110> direction in the (001) plane, and the ratio b/a is calculated. The results are listed in the column "b/a" of "synthetic single crystal diamond" in Table 1. The smaller the value of b/a, the greater the elastic deformation property, the higher the toughness, and the better the chipping resistance.

(Breaking Strength Test)

A spherical diamond indenter having R of 50 μm is prepared, a load is applied to the synthetic single crystal diamond/diamond single crystal of each sample at a loading speed of 100 N/min at room temperature (23° C.), and the load at the moment when a crack occurred in the sample (cracking load) is measured. Since the specific measurement method has been described in the first embodiment, the description thereof will not be repeated. The results are listed in the column "cracking load" of "synthetic single crystal diamond/diamond single crystal" in Table 1. The larger the cracking load, the higher the strength of the sample and the better the chipping resistance.

<Discussion>

Samples 3 to 8, samples 11 to 13, samples 15, 16, 18, and 19 correspond to examples. Samples 1, 2, 9, 10, 14, and 17 correspond to comparative examples.

The synthetic single crystal diamond of the example has a smaller ratio b/a of diagonal lines of the (001) <110> Knoop indentation, and has a greater elastic deformation, a higher toughness, and a better chipping resistance than the synthetic single crystal diamond of the comparative example. Further, the synthetic single crystal diamond of the example has a high (001) <100> Knoop hardness of 110 GPa or more, and is thereby excellent in wear resistance.

The embodiment and the examples of the present disclosure have been described as described above, and originally, appropriate combinations or various modifications of the configurations of individual embodiments and Examples described above are also planned.

It should be understood that the embodiments and examples disclosed herein have been presented for the purpose of illustration and description but not limited in all aspects. It is intended that the scope of the present invention is defined by the scope of the claims, rather than the embodiments and examples described above, and encompasses all modifications within the scope and meaning equivalent to the scope of the claims.

REFERENCE SIGNS LIST

1: diamond single crystal; 2: insulator; 3: carbon source, 4: solvent metal; 5: seed crystal; 6: pressure medium; 7: graphite heater; 10: sample chamber

The invention claimed is:

1. A synthetic single crystal diamond containing conjugants each composed of one vacancy and one boron atom, the concentration of boron atoms based on atom numbers being 0.1 ppm or more and 100 ppm or less, wherein, when the synthetic single crystal diamond is irradiated with excitation light having a wavelength of 488 nm, 514 nm, or 532 nm, a fluorescence spectrum of the synthetic single crystal diamond exhibits a luminescence peak within a fluorescence wavelength range of 776.4±1 nm.

2. The synthetic single crystal diamond according to claim 1, wherein a ratio b/a of a length b of a short diagonal line to a length a of a long diagonal line in a pair of diagonal lines of a Knoop indentation in a <110> direction in a (001) plane of the synthetic single crystal diamond is 0.08 or less, and the Knoop indentation is formed in measuring a Knoop hardness of the synthetic single crystal diamond according to JIS Z 2251:2009 under conditions of a temperature of 23° C.±5° C. and a test load of 4.9 N.

3. The synthetic single crystal diamond according to claim 1, wherein the synthetic single crystal diamond has a Knoop hardness of 110 GPa or more in the <100> direction in the (001) plane.

4. The synthetic single crystal diamond according to claim 1, wherein the synthetic single crystal diamond has a cracking load of 12 N or more in a breaking strength test in which a spherical diamond indenter having a tip radius of 50 μm is pressed against a surface of the synthetic single crystal diamond at a loading speed of 100 N/min.

* * * * *